(12) United States Patent
Wittenbreder

(10) Patent No.: US 6,452,814 B1
(45) Date of Patent: Sep. 17, 2002

(54) ZERO VOLTAGE SWITCHING CELLS FOR POWER CONVERTERS

(75) Inventor: Ernest H. Wittenbreder, Flagstaff, AZ (US)

(73) Assignee: Technical Witts, Inc., Flagstaff, AZ (US)

( * ) Notice: Subject to any disclaimer, the term of this patent is extended or adjusted under 35 U.S.C. 154(b) by 0 days.

(21) Appl. No.: 09/956,711

(22) Filed: Sep. 19, 2001

(51) Int. Cl.[7] ............................................. H02M 3/335
(52) U.S. Cl. ..................................... 363/16; 363/127
(58) Field of Search ..................... 363/16, 17, 127; 323/208, 209

(56) References Cited

U.S. PATENT DOCUMENTS

| | | | | |
|---|---|---|---|---|
| 5,402,329 A | * | 3/1995 | Wittenbreder, Jr. | 363/16 |
| 5,414,613 A | * | 5/1995 | Chen | 363/89 |
| 5,748,457 A | * | 5/1998 | Poon et al. | 363/16 |
| 6,147,886 A | * | 11/2000 | Wittenbreder | 363/95 |
| 6,195,270 B1 | * | 2/2001 | Wittenbreder | 363/17 |
| 6,198,260 B1 | * | 3/2001 | Wittenbreder | 323/271 |
| 6,272,023 B1 | * | 8/2001 | Wittenbreder | 363/16 |

* cited by examiner

Primary Examiner—Adolf Deneke Berhane

(57) ABSTRACT

Zero voltage switching cells using a small magnetic circuit element, a pair of switches, and a capacitor are revealed. The application of the zero voltage switching cells to any of a wide variety of hard switching power converter topologies yields equivalent power converters with zero voltage switching properties, without the requirement that the magnetizing current in the main magnetic energy storage element be reversed during each switching cycle. The new switching cells either provide integral line filtering or a means to accomplish zero voltage switching with no high side switch drive mechanism. In the subject invention the energy required to drive the critical zero voltage switching transition is provided by the small magnetic circuit element, either a single winding choke or a two winding coupled choke, that forms part of the zero voltage switching cell. The application of the zero voltage switching cells to buck, buck boost, Cuk, flyback, and forward converters is shown. A variation of the zero voltage switching cell which adds a single diode to clamp ringing associated with the magnetic circuit elements and parasitic capacitance of off switches is also revealed.

9 Claims, 14 Drawing Sheets

ZERO VOLTAGE SWITCHING CELLS FOR POWER CONVERTERS

BACKGROUND OF THE INVENTION

1. Field of the Invention

The subject invention generally pertains to electronic power conversion circuits, and more specifically to high frequency, switched mode power electronic converter circuits.

2. Description of Related Art

There are some power conversion circuits which accomplish higher efficiencies by implementing a mechanism that accomplishes switching at zero voltage. Power loss in a switch is the product of the voltage applied across the switch and the current flowing through the switch. In a switching power converter, when the switch is in the on state, the voltage across the switch is zero, so the power loss is zero. When the switch is in the off state, the power loss is zero, because the current through the switch is zero. During the transition from on to off, and vice versa, power losses can occur, if there is no mechanism to switch at zero voltage or zero current. During the switching transitions, energy losses will occur if there is simultaneously (1) non-zero voltage applied across the switch and (2) non-zero current flowing through the switch. The energy lost in each switching transition is equal to the time integral of the product of switch voltage and switch current. The power losses associated with the switching transitions will be the product of the energy lost per transition and the switching frequency. The power losses that occur because of these transitions are referred to as switching losses by those people who are skilled in the art of switching power converter design. In zero voltage switching converters the zero voltage turn off transition is accomplished by turning off a switch in parallel with a capacitor and a diode when the capacitor's voltage is zero. Often the capacitor and the diode are intrinsic parts of the switch. The capacitor maintains the applied voltage at zero across the switch as the current through the switch falls to zero. In the zero voltage transition the current in the switch is transferred to the parallel capacitor as the switch turns off.

The zero voltage turn on transition is accomplished by discharging the parallel capacitor using the energy stored in a magnetic circuit element, such as an inductor or transformer, and turning on the switch after the parallel diode has begun to conduct. During the turn on transition the voltage across the switch is held at zero, clamped by the parallel diode. The various zero voltage switching (ZVS) techniques differ in the control and modulation schemes used to accomplish regulation, in the energy storage mechanisms used to accomplish the zero voltage turn on transition, and in a few cases on some unique switch timing mechanisms.

There are a few examples of zero voltage switching cells and power converters that contain zero voltage switching cells that have been patented. Examples include U.S. Pat. No. 6,198,260 and U.S. Pat. No. 6,259,235.

In most cases the zero voltage switching cells enable the switching frequency to be increased while still maintaining high efficiency. The higher switching frequency allows smaller magnetic circuit elements and capacitors to be used achieving cost savings and an increase in power density. One limitation is that the higher switching frequency also brings higher electromagnetic interference, particularly in circuit topologies that have pulsating input or output currents. This problem could be alleviated if the zero voltage switching cell could also provide an inherent filtering action.

Another shortcoming of some zero voltage switching schemes is that an additional active switch is required and often the second switch requires a high side driver which can be accomplished with an IC made specifically for high side drive or by using a gate drive transformer. An example of such a circuit is illustrated in FIG. 12 of U.S. Pat. No. 5,402,329. The gate drive transformer or high side driver circuit adds expense and space to the power converter. A zero voltage switching cell that does not require a high side drive mechanism would provide a unique advantage.

Objects and Advantages

An object of the subject invention is to provide a power converter which is relatively simple and is capable of delivering output power at high efficiencies and high switching frequencies.

Another object of the subject invention is to provide a generally applicable zero voltage switching cell that when substituted for the main switch of a hard switching power converter eliminates first order switching losses and provides non-pulsating input terminal currents.

Another object of the subject invention is to provide a generally applicable zero voltage switching cell that when substituted for the main switch of a hard switching power converter eliminates first order switching losses and does not require a high side drive mechanism.

Further objects and advantages of my invention will become apparent from a consideration of the drawings and ensuing description.

These and other objects of the invention are provided by a novel circuit technique that uses a generalized active reset switching cell consisting of two switches, a reset capacitor, and a small resonator choke or coupled inductor. The critical zero voltage switching transitions are accomplished using the stored magnetic energy in the small resonator choke or coupled inductor.

Figure 1:
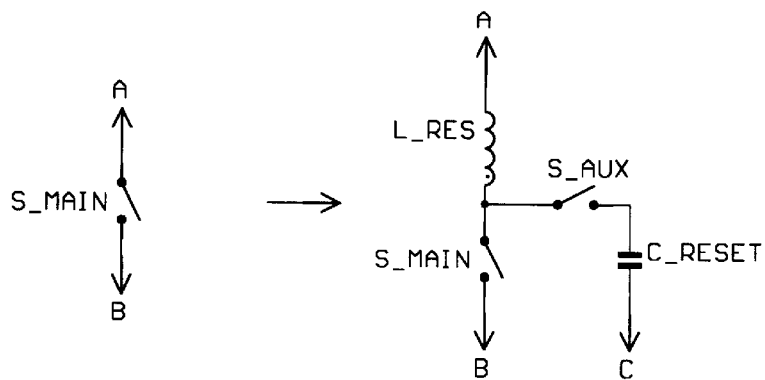
FIG. 1 illustrates the substitution of a main switch by a zero voltage switching cell with integral filter according to the subject invention.
Figure 2:
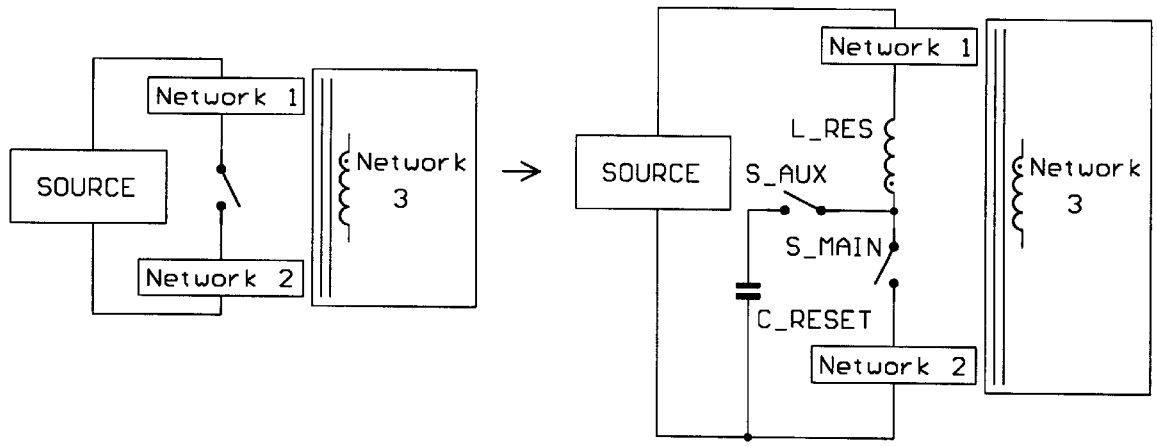
FIG. 2 illustrates the transformation from a generalized hard switching power converter to an improved power converter containing one form of the zero voltage switching cell with integral filter of the subject invention.
Figure 3:
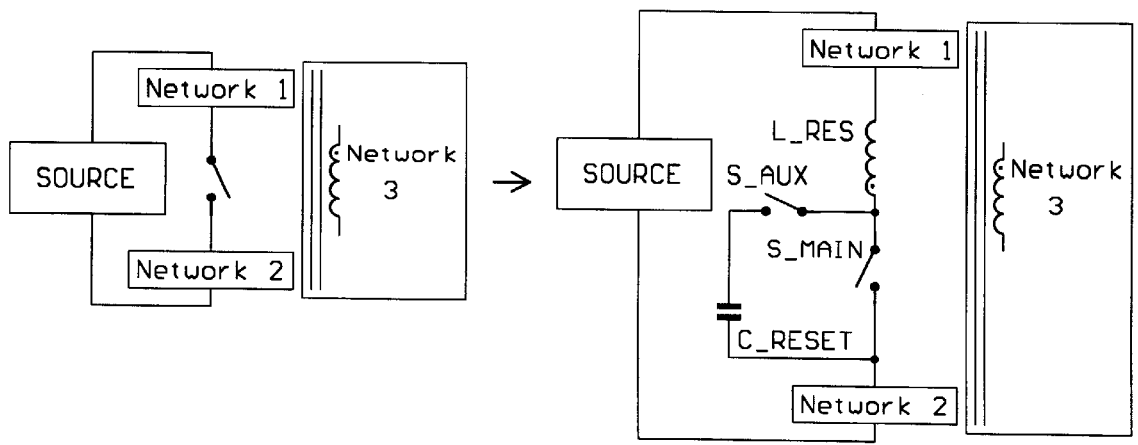
FIG. 3 illustrates the transformation from a generalized hard switching power converter to an improved power converter containing another form of the zero voltage switching cell of the subject invention.

| Reference Numerals | |
|---|---|
| 100 DC input voltage source | 101 inductor |
| 102 inductor | 103 switch |
| 104 switch | 105 switch |
| 106 diode | 107 diode |
| 108 diode | 109 capacitor |
| 110 capacitor | 111 capacitor |
| 112 capacitor | 113 capacitor |
| 114 load | 115 node |
| 116 node | 117 node |
| 118 node | 119 node |
| 120 node | 121 node |
| 122 node | 123 lead |
| 124 lead | 125 lead |
| 200 DC input voltage source | 201 transformer |
| 202 transformer | 203 switch |
| 204 switch | 205 switch |
| 206 diode | 207 diode |
| 208 diode | 209 capacitor |
| 210 capacitor | 211 capacitor |
| 212 capacitor | 213 capacitor |
| 214 load | 215 node |
| 216 node | 217 node |
| 218 node | 219 node |
| 220 node | 221 node |
| 222 node | 223 lead |

SUMMARY

The subject invention uses a zero voltage switching cell consisting of two switches, a capacitor, and a small magnetic circuit element in a variety of converter topologies as a substitute for the main switch to form zero voltage switching converters with similar properties to the original hard switching forms of the converters, except that first order switching losses are eliminated. For a simple inductor version the inductor provides non-pulsating input terminal current so that the switching cell functions as a zero voltage switching cell with an integral input filter. For a coupled inductor version an isolated switch can be a low side N channel switch like the main switch thereby obviating a high side drive mechanism. During the off time of each switching cycle the current in the small magnetic circuit element of the zero voltage switching cell reverses direction so that there is energy available in the small inductor or coupled inductor to drive every switching transition.

DESCRIPTION OF THE PREFERRED EMBODIMENTS

Zero Voltage Switching Cells with Integral Filter

Figure 4:
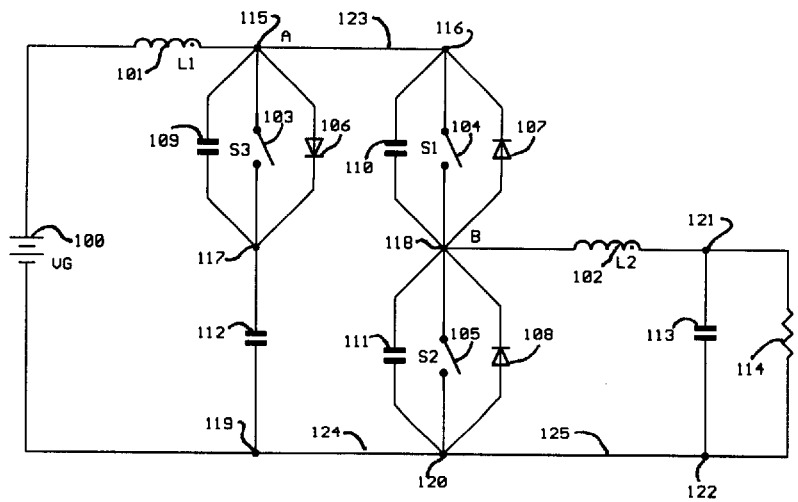
FIG. 4 illustrates a buck converter containing the zero voltage switching cell with integral filter of the subject invention.

FIG. 4 illustrates a buck converter employing the zero voltage switching cell with integral filter of the subject invention. The zero voltage switching cell with integral filter of the subject invention can be used to provide zero voltage switching and input filtering to a wide variety of hard switching converter topologies.

Referring to FIG. 4, there is shown a buck type power processing topology. The circuit employs a source of substantially DC voltage, a switching network consisting of three switches, a reset capacitor, a small resonator inductor, L1, a main choke, L2, a main filter capacitor, and a load. For purposes of the operational state analysis, it is assumed that the reset and output filter capacitors are sufficiently large that the voltages developed across these capacitors are approximately constant over a switching interval. It is also assumed that the main choke is sufficiently large that the current in the main choke is approximately constant over a switching cycle. Also for purposes of the operational state analysis, it is assumed that the input DC voltage source has sufficiently low source impedance that the voltage developed across the input DC voltage source is approximately constant over a switching interval. It will be assumed that the parasitic capacitors that parallel the switches are small and their effects can be ignored, except during the switching transitions. It will be assumed that diodes are ideal and have no leakage and no forward voltage drop. It will finally be assumed that the power switches are ideal, that is, lossless and able to carry current in either direction.

Structure

The structure of the circuit of the subject invention is shown in FIG. 4. A first terminal of an input source of DC potential 100 is connected to a first terminal of an inductor 101. A second terminal of source 100 is connected to a node 119. A second terminal of inductor 101 is connected to a node 115. A first terminal of a capacitor 109 is connected to node 115. A second terminal of capacitor 109 is connected to a node 117. A first terminal of a switch 103 is connected to node 115. A second terminal of switch 103 is connected to node 117. An anode terminal of a diode 106 is connected to node 115. A cathode terminal of diode 106 is connected to node 117. A first terminal of a capacitor 112 is connected to node 117. A second terminal of capacitor 112 is connected to node 119. A lead 123 is connected to node 115 and to a node 116. A first terminal of a capacitor 110 is connected to node 116. A second terminal of capacitor 110 is connected to a node 118. A first terminal of a switch 104 is connected to node 116. A second terminal of switch 104 is connected to node 118. A cathode terminal of a diode 107 is connected to node 116. An anode terminal of diode 107 is connected to node 118. A first terminal of a capacitor 111 is connected to node 118. A second terminal of capacitor 111 is connected to a node 120. A first terminal of a switch 105 is connected to node 118. A second terminal of switch 105 is connected to node 120. A cathode terminal of a diode 108 is connected to node 118. An anode terminal of a diode 108 is connected to node 120. A lead 124 is connected to node 119 and to node 120. A first terminal of an inductor 102 is connected to node 118. A second terminal of inductor 102 is connected to a node 121. A first terminal of a capacitor 113 is connected to node 121. A second terminal of capacitor 113 is connected to a node 122. A first terminal of a load 114 is connected to node 121. A second terminal of load 114 is connected to node 122. A lead 125 is connected to node 122 and to node 120.

Operation

It is assumed in this analysis that the system has reached a settled operating condition. Except for the short, but finite, switching intervals there are two states of the circuit of FIG. 4, an on state and an off state. It is also assumed, for purpose of analysis, that the switching intervals between the states are approximately zero seconds and that capacitors 109, 110, and 111 are small and do not contribute significantly to the operation of the converter, except during the brief switching transitions. It is also assumed that the capacitors 112 and 113 are large and the voltages on these capacitors are constant over a switching cycle. The operation of the zero voltage switching cell with integral filter of the subject invention is described as it applies to a buck converter.

Figure 5:
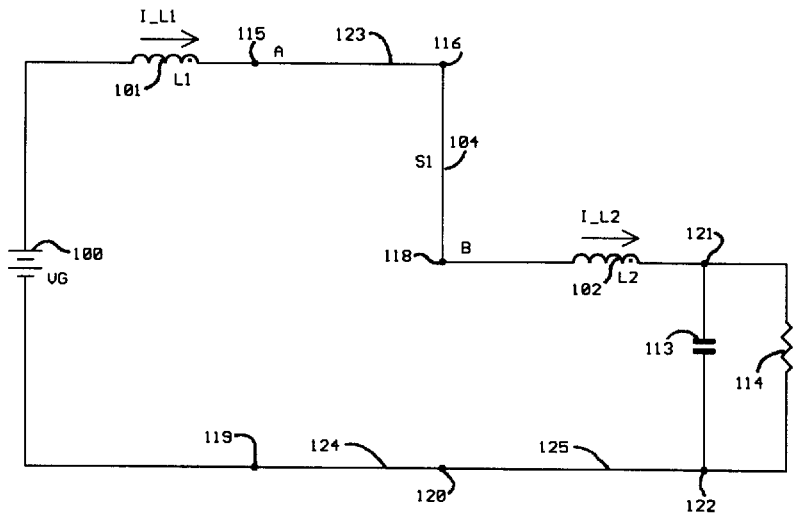
FIG. 5 illustrates an on state of the FIG. 4 circuit.
Figure 6:
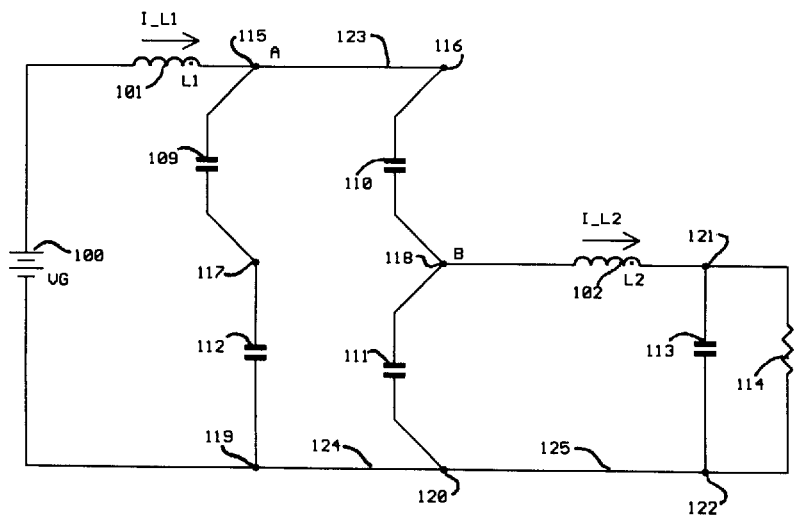
FIG. 6 illustrates a first phase of a turn off transition of the FIG. 4 circuit.
Figure 7:
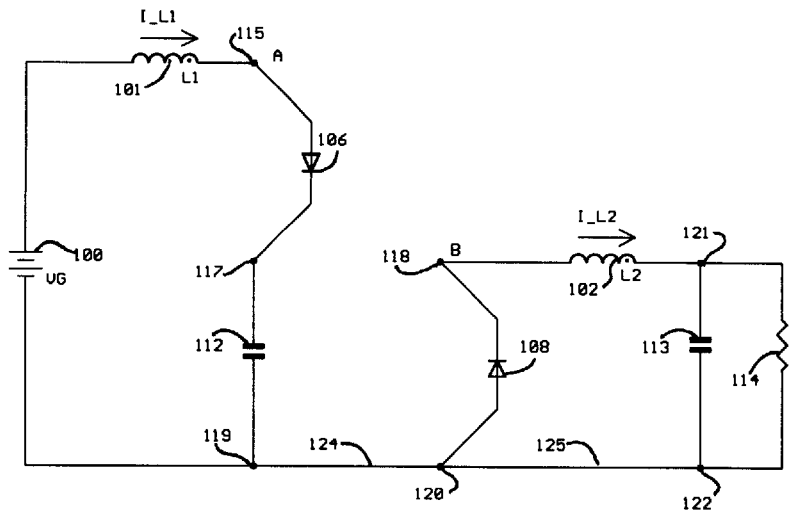
FIG. 7 illustrates a second phase of a turn off transition of the FIG. 4 circuit.
Figure 8:
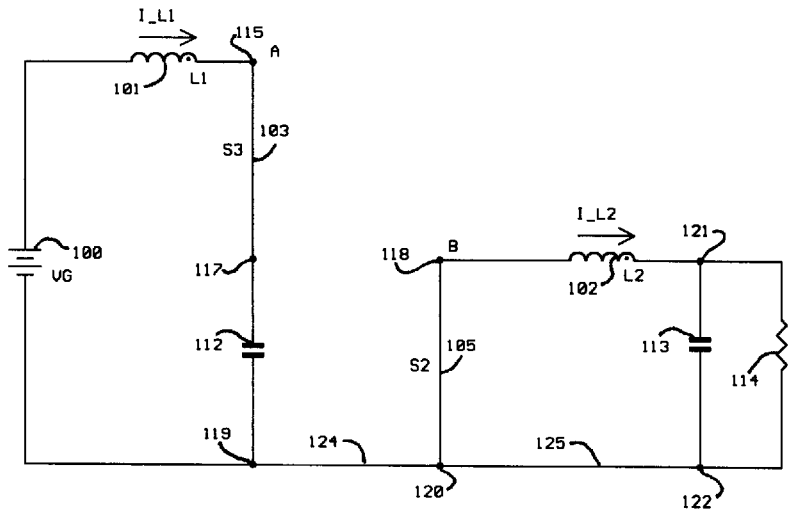
FIG. 8 illustrates an off state of the FIG. 4 circuit.
Figure 9:
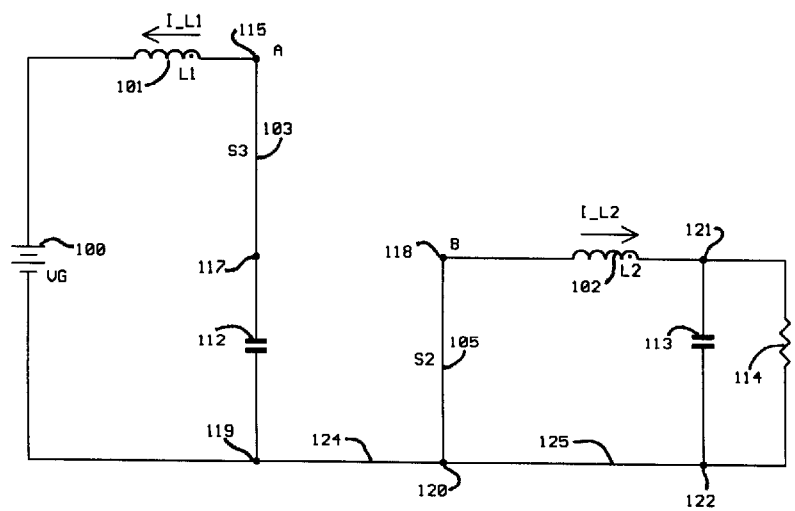
FIG. 9 illustrates the off state of the FIG. 4 circuit after the current in the S3 switch has reversed direction.
Figure 10:
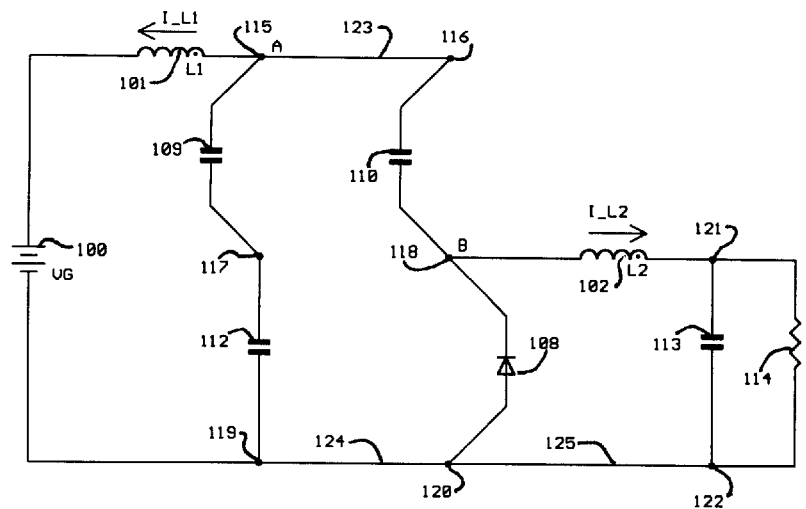
FIG. 10 illustrates a first phase of a turn on transition of the FIG. 4 circuit.
Figure 11:
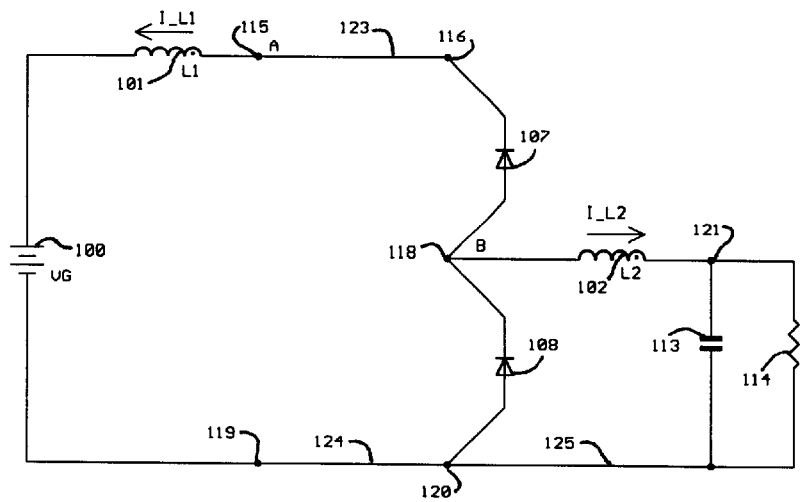
FIG. 11 illustrates a second phase of a turn on transition of the FIG. 4 circuit.
Figure 12:
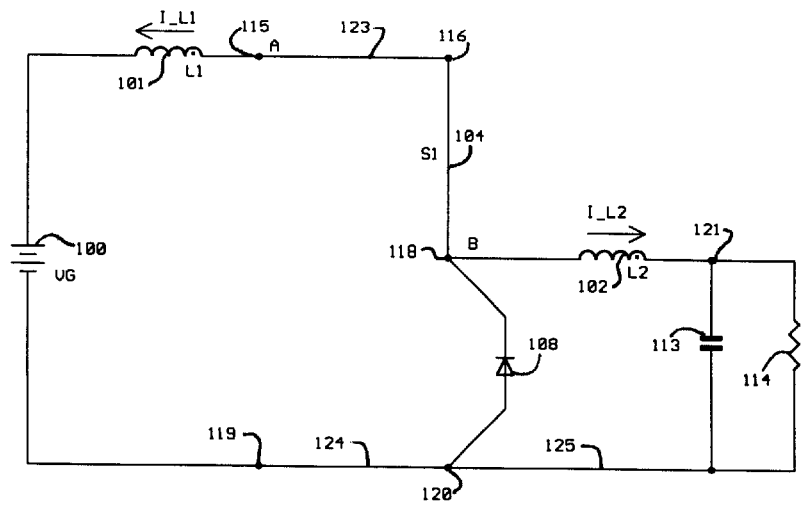
FIG. 12 illustrates a third phase of a turn on transition of the FIG. 4 circuit.
Figure 13:
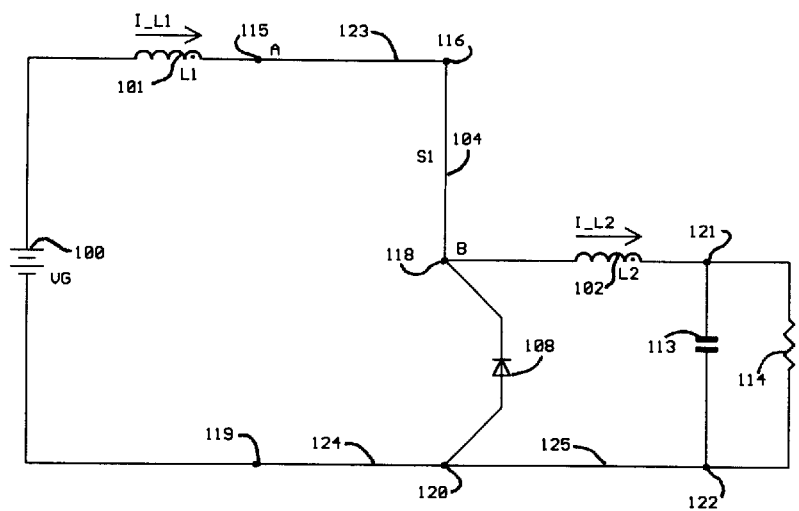
FIG. 13 illustrates a fourth phase of a turn on transition of the FIG. 4 circuit.
Figure 14:
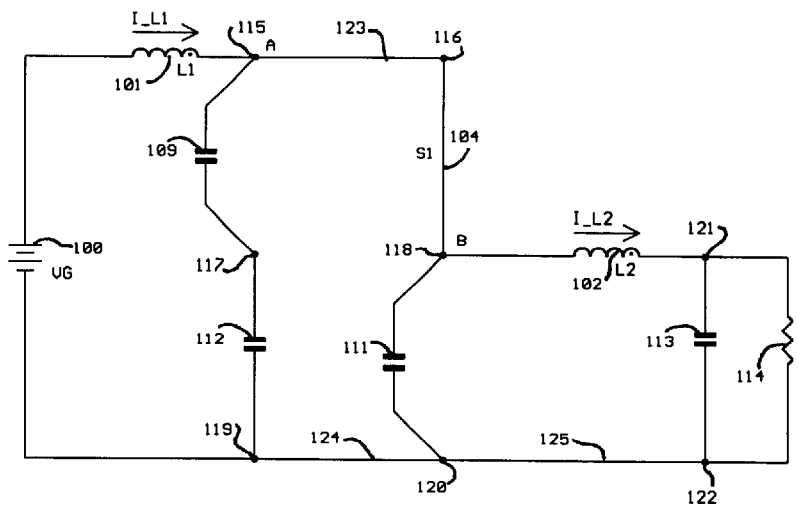
FIG. 14 illustrates a fifth phase of a turn on transition of the FIG. 4 circuit.
Figure 15:
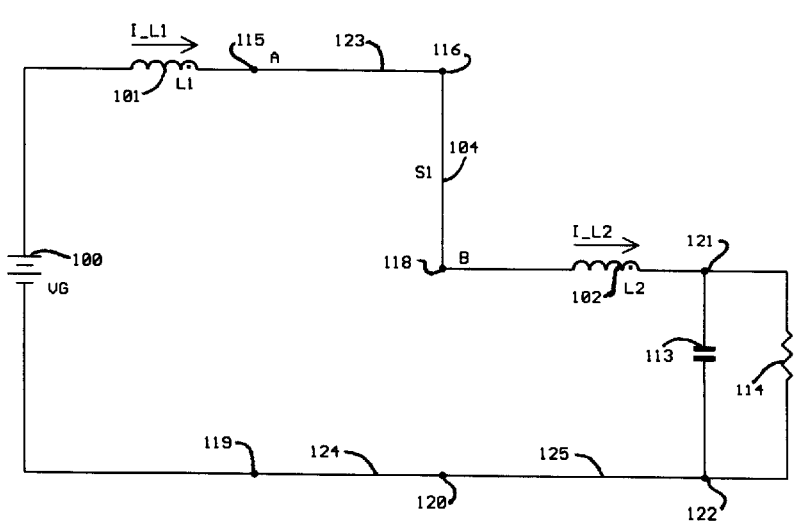
FIG. 15 illustrates the on state of the FIG. 4 circuit.
Figure 16:
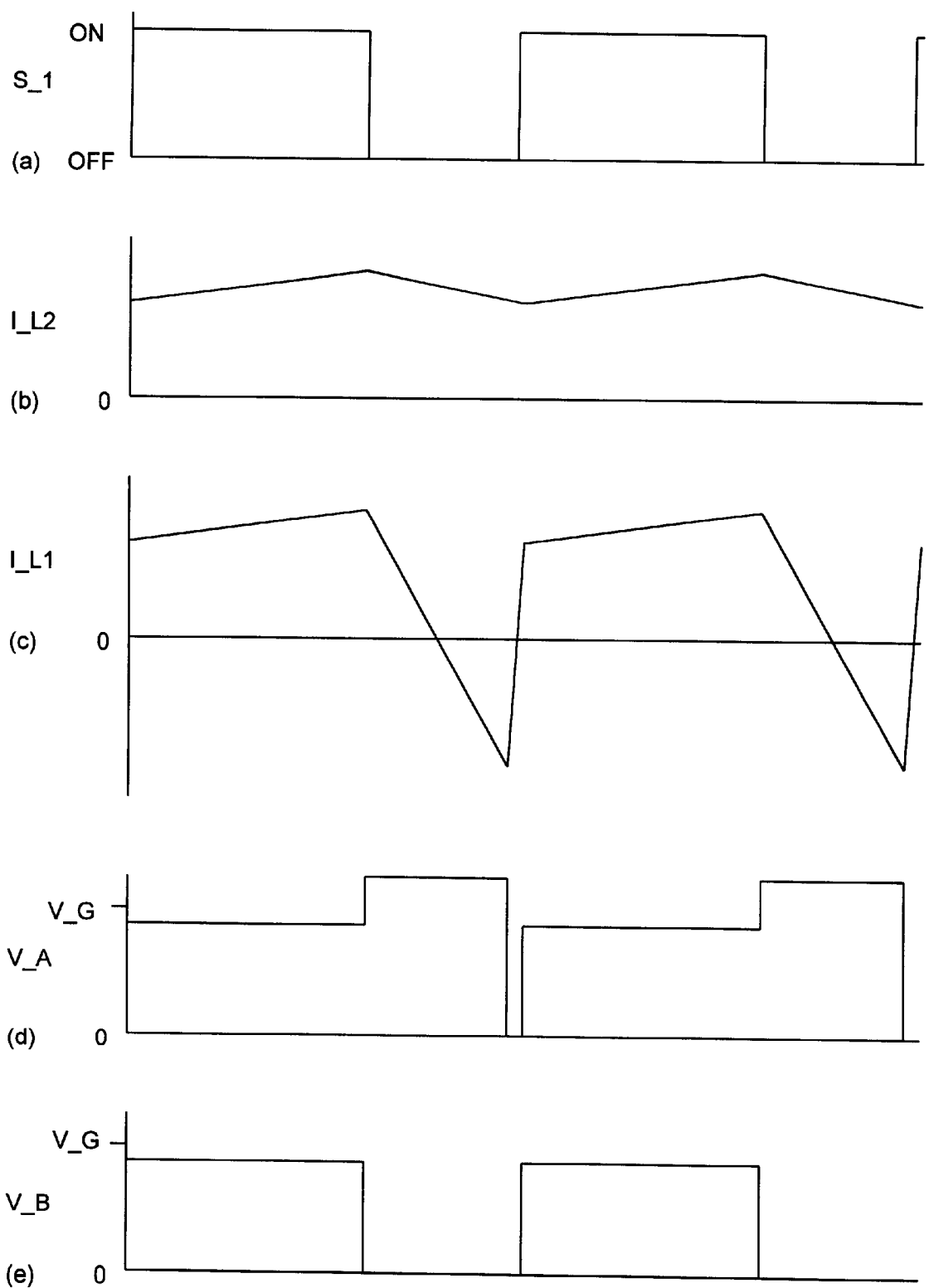
FIG. 16(a) illustrates the S1 switch timing of the FIG. 4 circuit.
FIG. 16(b) illustrates the L2 current wave form of the FIG. 4 circuit.
FIG. 16(c) illustrates the L1 current wave form of the FIG. 4 circuit.
FIG. 16(d) illustrates the voltage at the node A of the FIG. 4 circuit.
FIG. 16(e) illustrates the voltage at the node B of the FIG. 4 circuit.

In operation consider an initial condition, illustrated in FIG. 5, in which the switch 104 is on and the other two switches are off. Current flows through the two inductors, 101 and 102 to the load and stored energy and current in the two inductors is increasing in magnitude, as indicated in FIGS. 16(b) and 16(c). At a time determined by the control circuit the switch 104 is turned off (opened), as illustrated in FIG. 6. During the interval illustrated by FIG. 6 capacitor 110 is charged while the capacitors 109 and 111 are discharged, due to the currents and stored energies in the inductors 101 and 102, as the voltage at node 118 falls and the voltages at nodes 115 and 116 rise, until the diodes 106 and 108 are forward biased, as illustrated in FIG. 7. Shortly after diodes 106 and 108 begin to conduct, switches 103 and 105 are turned on (closed), as illustrated in FIG. 8. The circuits of FIGS. 8 and 9 represent the off state of the converter. During the off state the voltage applied to the small inductor 101 causes its current to decrease to zero and then increase in the negative direction, as illustrated in FIG. 9 and FIG. 16(c). During the off state, all of the energy stored in the inductor 101 is transferred to the capacitor 112 and back to the inductor 101, so that the energy stored in the inductor 101 is the same at the end of the off state as it was at the beginning of the off state, but the current in the inductor 101 is reversed. Because the inductor 101 is connected in series with the source 100, the source current is non-pulsating. At the end of the off state, as determined by the control circuit, the switches 103 and 105 are turned off (opened), as illustrated in FIG. 10. When switch 105 is turned off, the current in inductor 102 forces the diode 108 to conduct. When switch 103 is turned off, the current in inductor 101 forces current out of capacitors 109 and 110, so that capacitors 110 and 109 are discharged, until the diode 107 is forward biased, as illustrated in FIG. 11. Shortly after diode 107 begins to conduct, switch 104 is turned on (closed), as illustrated in FIG. 12. The applied voltage to the inductor 101 is now large and equal to the source 100 voltage, so that the current in the small inductor 101 changes rapidly in both magnitude and direction, as illustrated in FIG. 13 and FIG. 16(c), until the current in the inductor 101 is equal to the current in inductor 102, at which time the current in diode 108 becomes zero and the voltage at node 118 begins to rise, charging capacitor 111, as illustrated in FIG. 14. The voltage at node 118 will rise until the voltage reaches the level of the on state, as illustrated in FIGS. 15 and 16(e). The converter is now in the state of the initial condition, as illustrated in FIG. 5, which represents the on state of the converter. During the full cycle of operation each of the three switches were turned on and off at zero voltage.

Related Embodiments

Figure 17:
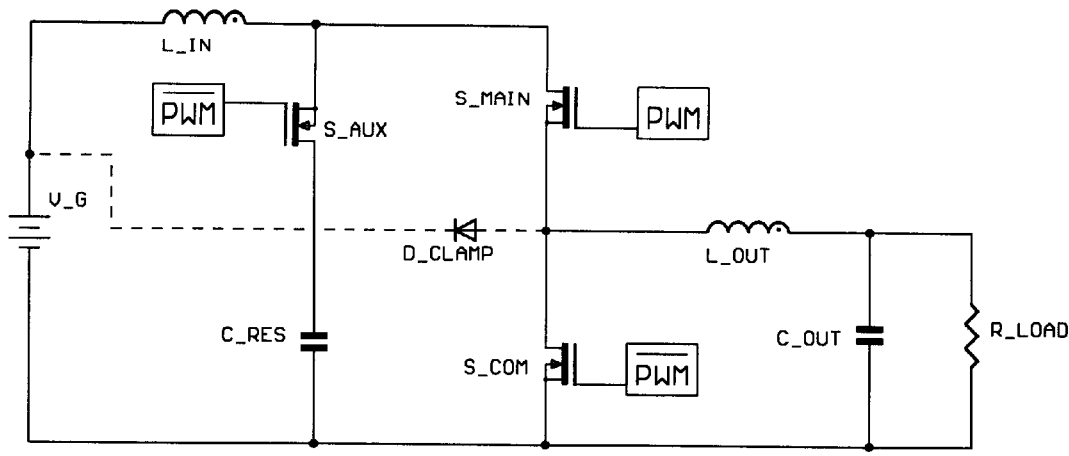
FIG. 17 illustrates the zero voltage switching cell with integral filter of the subject invention applied to a buck converter.

FIG. 17 illustrates an embodiment of the FIG. 4 circuit in which the switches S_MAIN, S_AUX, and S_COM are implemented with power mosfets and an optional diode, D_CLAMP, is illustrated that provides additional clamping for ringing associated with the inductors and the small capacitors associated with the switches. The body diode of S_AUX provides clamping of the ringing voltage to the voltage of the C_RES capacitor, but the D_CLAMP diode clamps the ringing to the source voltage.

Figure 18:
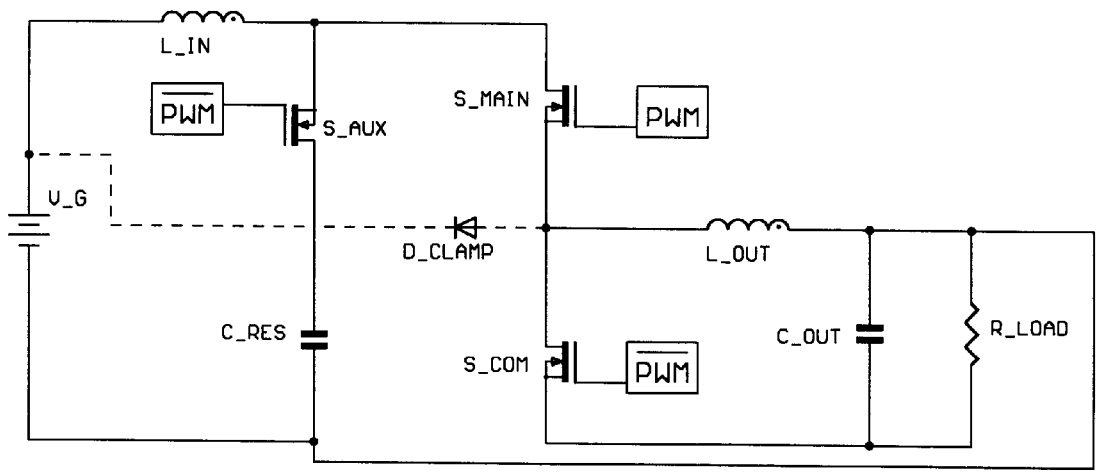
FIG. 18 illustrates the zero voltage switching cell with integral filter of the subject invention applied to a non-isolated flyback or buck boost converter.

FIG. 18 illustrates a non-isolated flyback converter similar to the FIG. 17 circuit implemented with mosfets and using the zero voltage switching cell of the subject invention.

Figure 19:
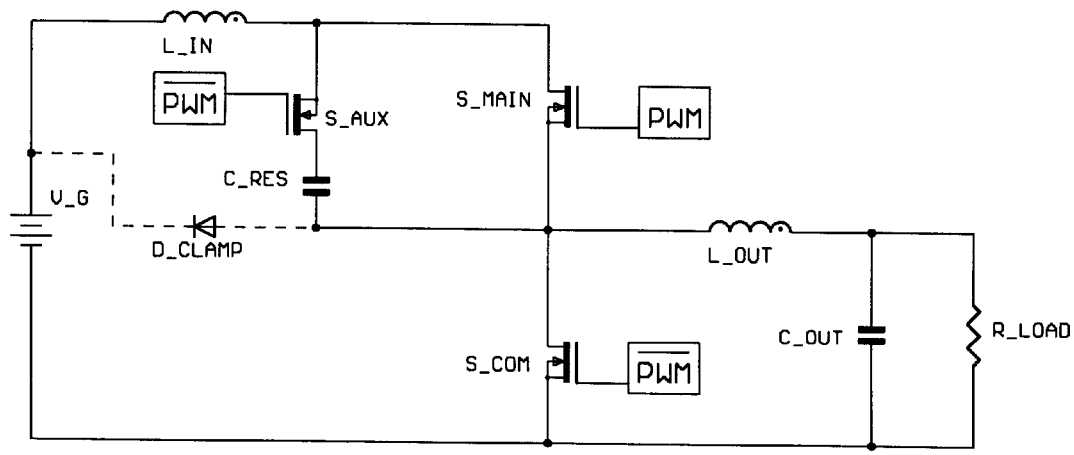
FIG. 19 illustrates an alternate form of the zero voltage switching cell with integral filter of the subject invention applied to a buck converter.

FIG. 19 illustrates the FIG. 17 circuit with an alternate connection of the reset capacitor, C_RES. The alternate connection alters the current wave form in the switch S_COM. At turn on of the switch S_COM the current in the switch is zero, but the peak current in S_COM which occurs near turn off is almost twice the peak switch current of the FIG. 17 circuit's S_COM peak switch current.

Figure 20:
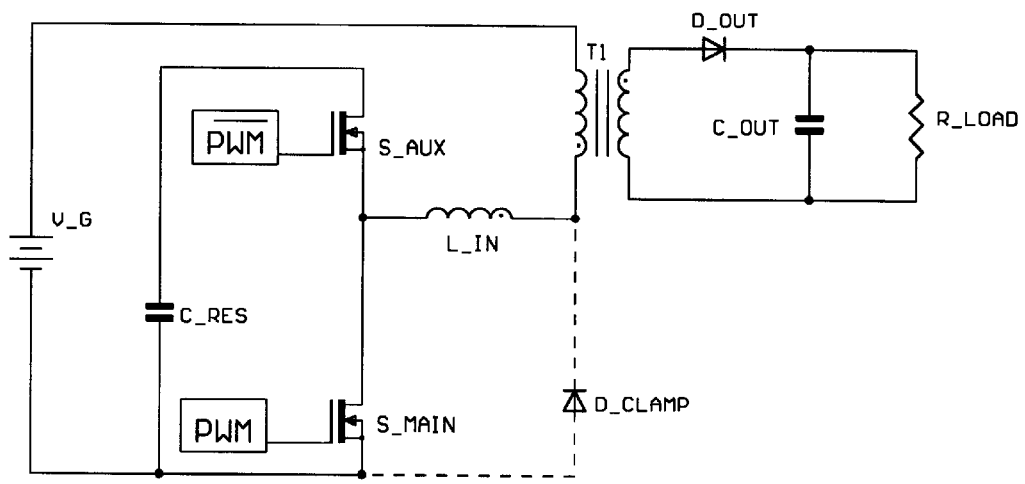
FIG. 20 illustrates the zero voltage switching cell with integral filter of the subject invention applied to an isolated flyback converter.

FIG. 20 illustrates a flyback converter which employs the zero voltage switching cell with integral filter of the subject invention.

Figure 21:
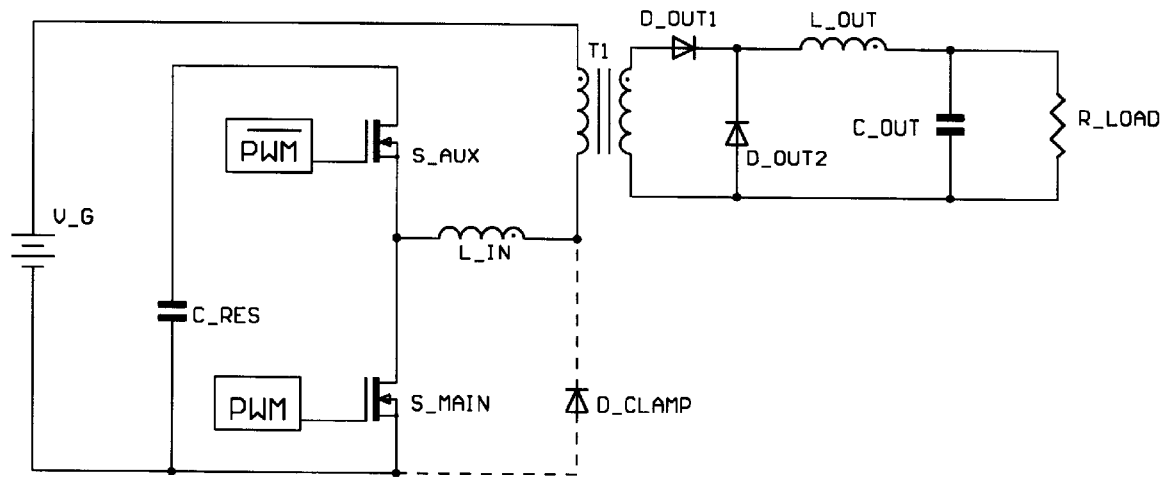
FIG. 21 illustrates the zero voltage switching cell with integral filter of the subject invention applied to a forward converter.

FIG. 21 illustrates a single ended forward converter which employs the zero voltage switching cell with integral filter of the subject invention.

Zero Voltage Switching Cell with Isolated Auxiliary Switch

Figure 22:
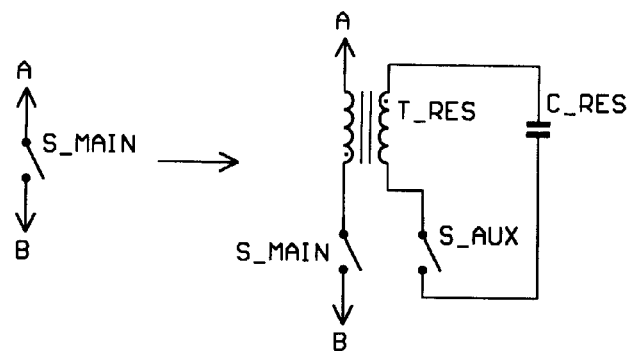
FIG. 22 illustrates the substitution of a main switch by a zero voltage switching cell with isolated reset circuit according to the subject invention.

FIG. 22 illustrates a zero voltage switching cell with an isolated auxiliary switch which, when substituted for the main switch in a hard switching power converter, eliminates switching losses in the main switch. One of the main advantages of the isolated auxiliary switch and reset circuit is that the auxiliary switch can be implemented without a high side drive mechanism and with no restriction on the type of switch used for the auxiliary switch. The fact that the reset circuit is isolated allows the circuit designer to connect the auxiliary switch to any convenient point in the circuit. In some prior art cases a high side switch can be obviated by using a P channel rather than the preferable N channel switch, but with the subject invention there is no restriction on the type of switch employed so that an N channel can be used without a high side drive mechanism. This is a significant advantage for converters that can benefit from zero voltage switching and do not already employ a high side drive mechanism. Also, except for a slight loss of duty cycle to the resonant switching transitions, the operation of the power converter external to the zero voltage switching cell is unaltered by the substitution of the zero voltage switching cell for the main switch. In most cases of the prior art the zero voltage switching mechanism increases component stresses in the power converter.

Figure 23:
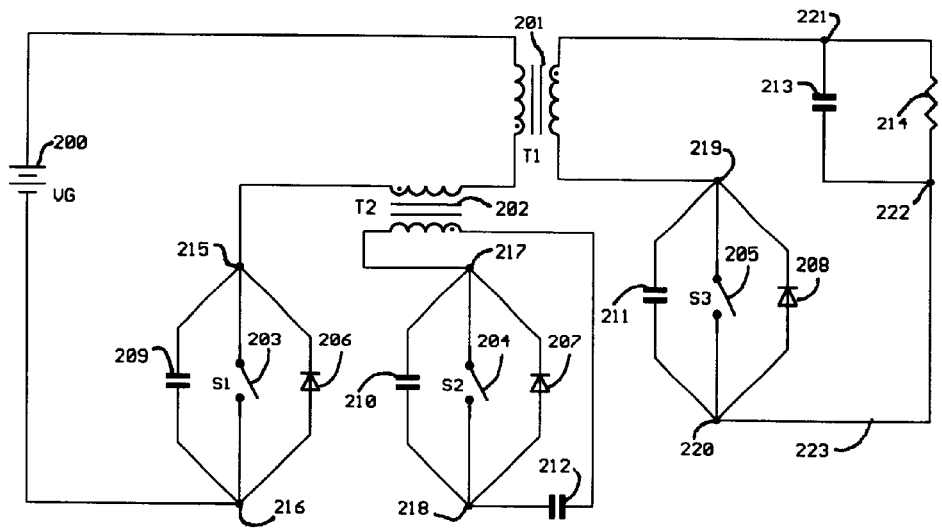
FIG. 23 illustrates an isolated flyback converter with the zero voltage switching cell with isolated reset circuit of the subject invention.

Referring to FIG. 23, there is shown a flyback type power processing topology. The circuit employs a source of substantially DC voltage, three switches, a reset capacitor, a small coupled resonator inductor, T2, a main coupled inductor, T1, an output filter capacitor, and a load. For purposes of the operational state analysis, it is assumed that the reset and output filter capacitors are sufficiently large that the voltages developed across the capacitors are approximately constant over a switching interval. Also for purposes of the operational state analysis, it is assumed that the input DC voltage source has sufficiently low source impedance that the voltage developed across the input DC voltage source is approximately constant over a switching interval. It will be assumed that the parasitic capacitors that parallel the switches are small and their effects can be ignored, except during the switching transitions. It will be assumed that diodes are ideal and have no leakage and no forward voltage drop. It will finally be assumed that the power switches are ideal, that is, lossless and able to carry current in either direction.

Structure

The structure of the circuit of the subject invention is shown in FIG. 23. A first terminal of a source 200 of DC potential is connected to an undotted terminal of a primary winding of a coupled inductor 201. A second terminal of source 200 is connected to a node 216. A dotted terminal of the primary winding of inductor 201 is connected to an undotted terminal of a primary winding of a coupled inductor 202. A dotted terminal of the primary winding of inductor 202 is connected to a node 215. A first terminal of a capacitor 209 is connected to node 215. A second terminal of capacitor 209 is connected to node 216. A first terminal of a switch 203 is connected to node 215. A second terminal of switch 203 is connected to node 216. A cathode terminal of a diode 206 is connected to node 215. An anode terminal of diode 206 is connected to node 216. A dotted terminal of a secondary winding of inductor 202 is connected to a first terminal of a reset capacitor 212. An undotted terminal of the secondary winding of inductor 202 is connected to a node 217. A first terminal of a capacitor 210 is connected to node 217. A second terminal of capacitor 212 is connected to a node 218. A second terminal of capacitor 210 is connected to node 218. A first terminal of a switch 204 is connected to node 217. A second terminal of switch 204 is connected to node 218. A cathode terminal of a diode 207 is connected to node 217. An anode terminal of diode 207 is connected to node 218. A dotted terminal of a secondary winding of inductor 201 is connected to a node 221. An undotted terminal of the secondary winding of inductor 201 is connected to a node 219. A first terminal of a capacitor 211 is connected to node 219. A second terminal of capacitor 211 is connected to a node 220. A first terminal of a switch 205 is connected to node 219. A second terminal of switch 205 is connected to node 220. A cathode terminal of a diode 208 is connected to node 219. An anode terminal of diode 208 is connected to node 220. A first terminal of a capacitor 213 is connected to node 221. A second terminal of capacitor 213 is connected to a node 222. A first terminal of a load 214 is connected to node 221. A second terminal of load 214 is connected to node 222. A lead 223 is connected to node 220 and to node 222.

Operation

It is assumed in this analysis that the system has reached a settled operating condition. Except for the short, but finite, switching intervals there are two states of the circuit of FIG. 23, an on state and an off state. It is also assumed, for purpose of analysis, that the switching intervals between the states are approximately zero seconds and that capacitors 209, 210, and 211 are small and do not contribute significantly to the operation of the converter, except during the brief switching transitions. It is also assumed that the capacitors 212 and 213 are large and the voltages on these capacitors are constant over a switching cycle. The circuit of FIG. 23 illustrates the operation of the zero voltage switching cell with isolated auxiliary switch of the subject invention as it applies to an isolated flyback converter.

Figure 24:
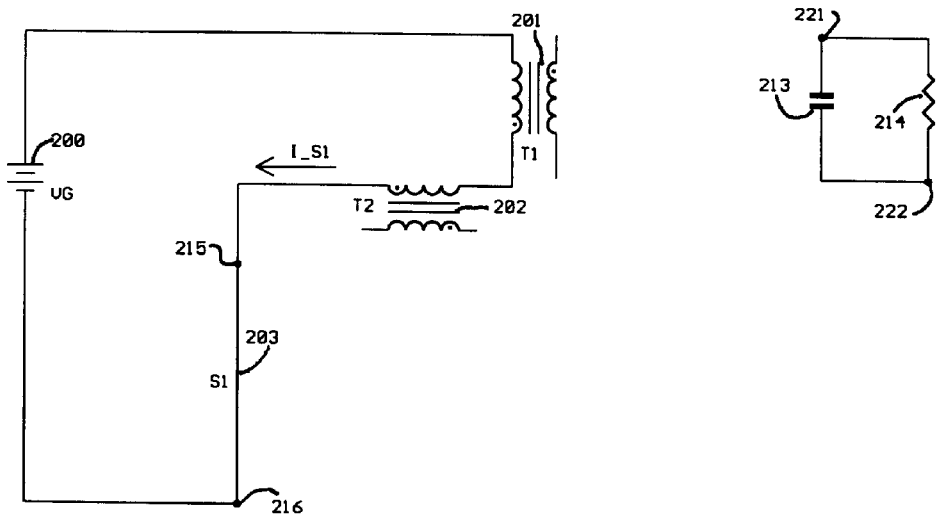
FIG. 24 illustrates an on state of the FIG. 23 circuit.
Figure 25:
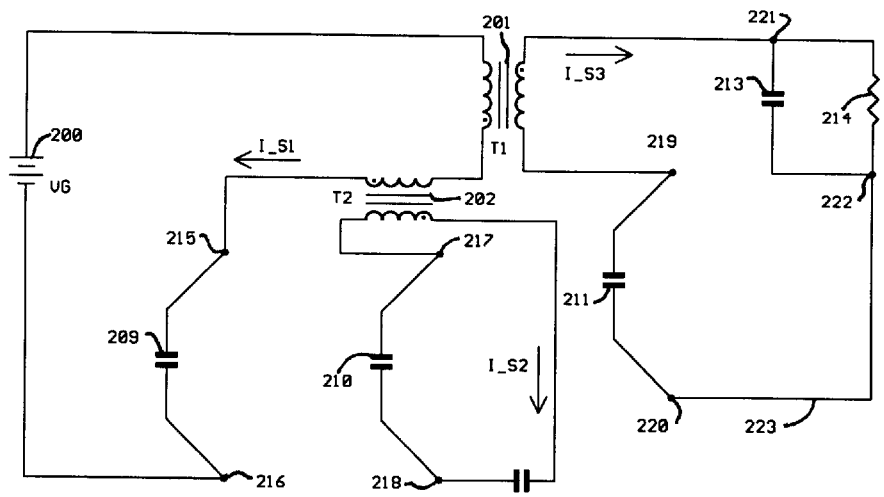
FIG. 25 illustrates a first phase of a turn off transition of the FIG. 23 circuit.
Figure 26:
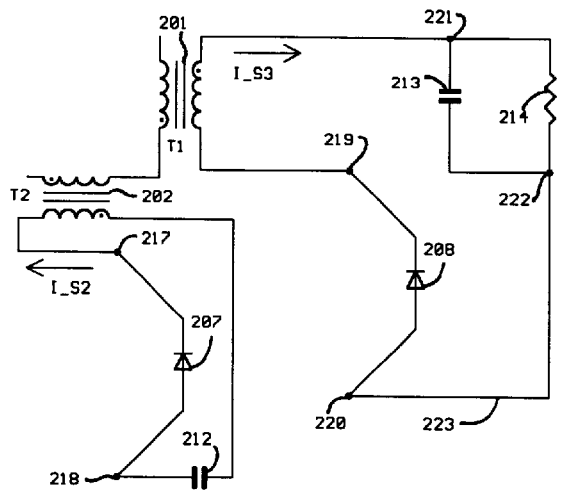
FIG. 26 illustrates a second phase of a turn off transition of the FIG. 23 circuit.
Figure 27:
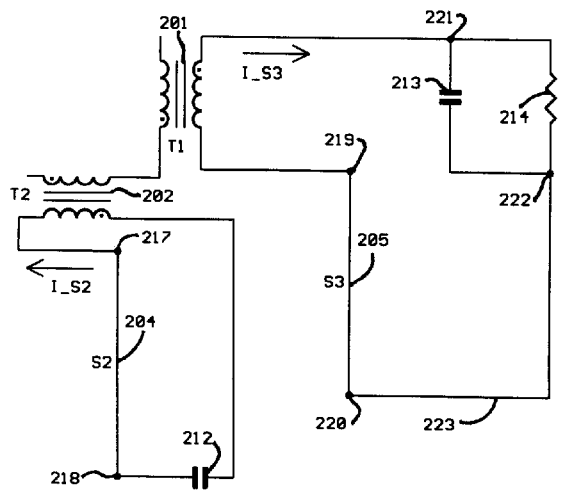
FIG. 27 illustrates an off state of the FIG. 23 circuit.
Figure 28:
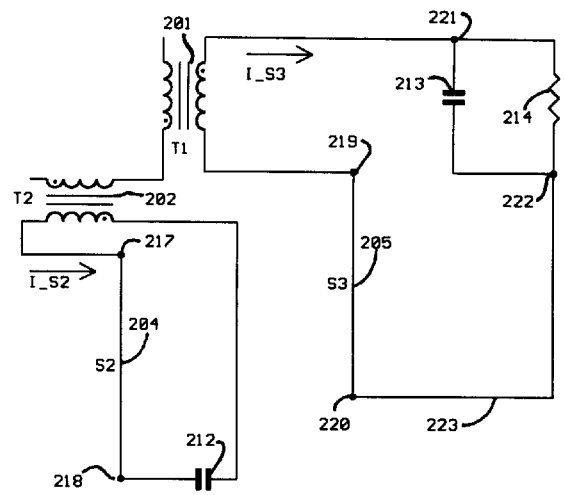
FIG. 28 illustrates the off state of the FIG. 23 circuit after the S2 switch current has reversed direction.
Figure 29:
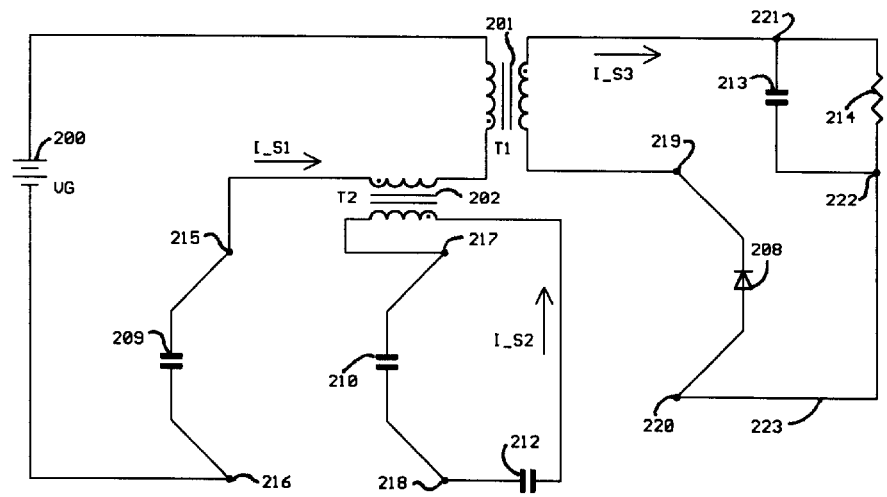
FIG. 29 illustrates a first phase of a turn on transition of the FIG. 23 circuit.
Figure 30:
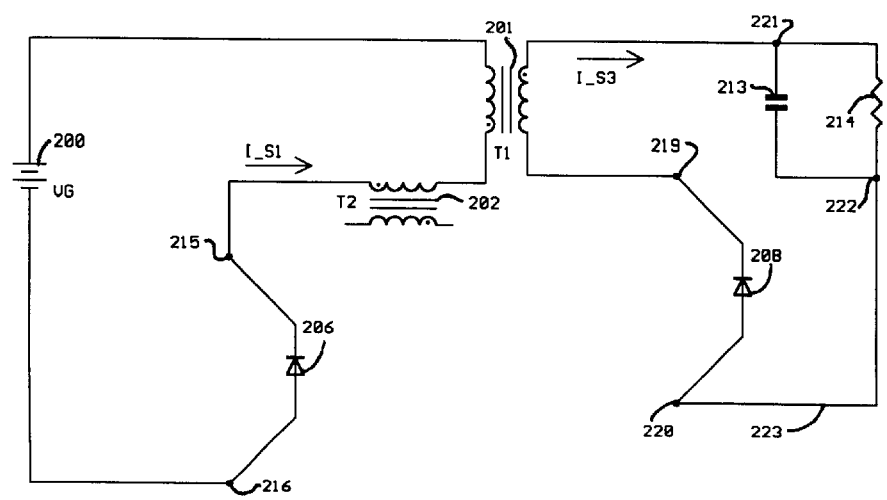
FIG. 30 illustrates a second phase of a turn on transition of the FIG. 23 circuit.
Figure 31:
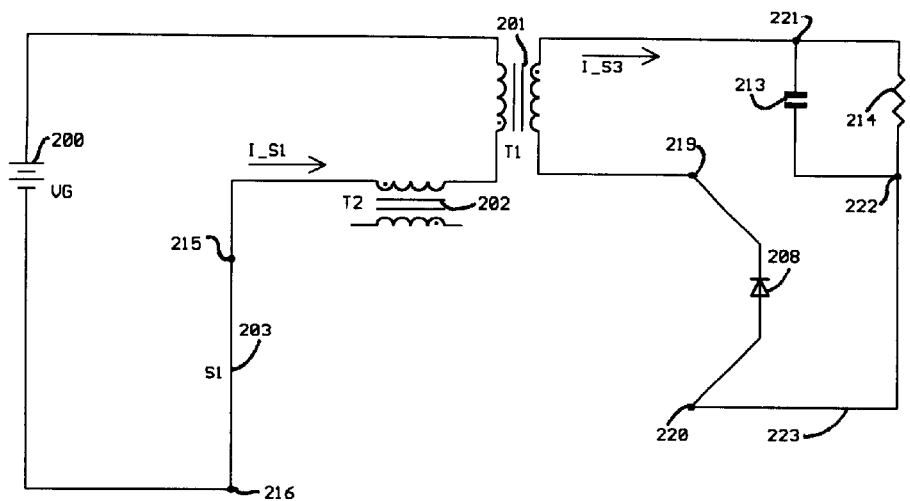
FIG. 31 illustrates a third phase of a turn on transition of the FIG. 23 circuit.
Figure 32:
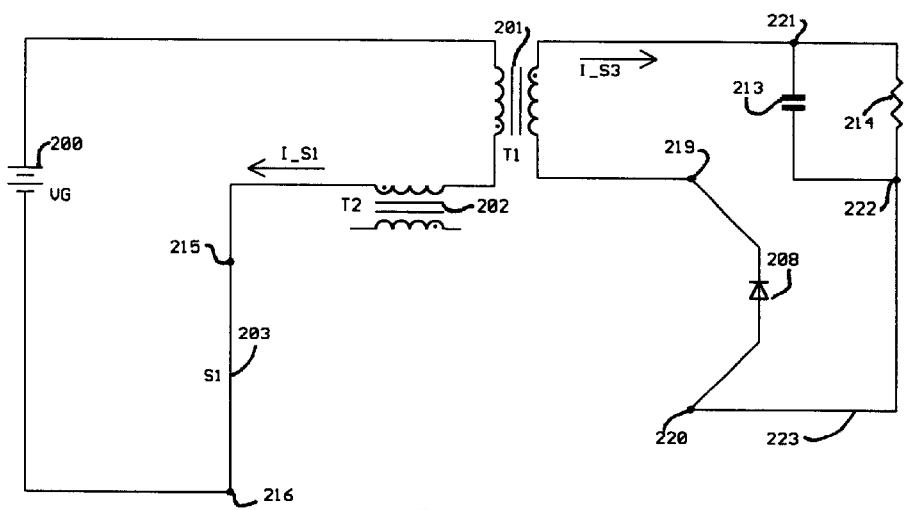
FIG. 32 illustrates a fourth phase of a turn on transition of the FIG. 23 circuit.
Figure 33:
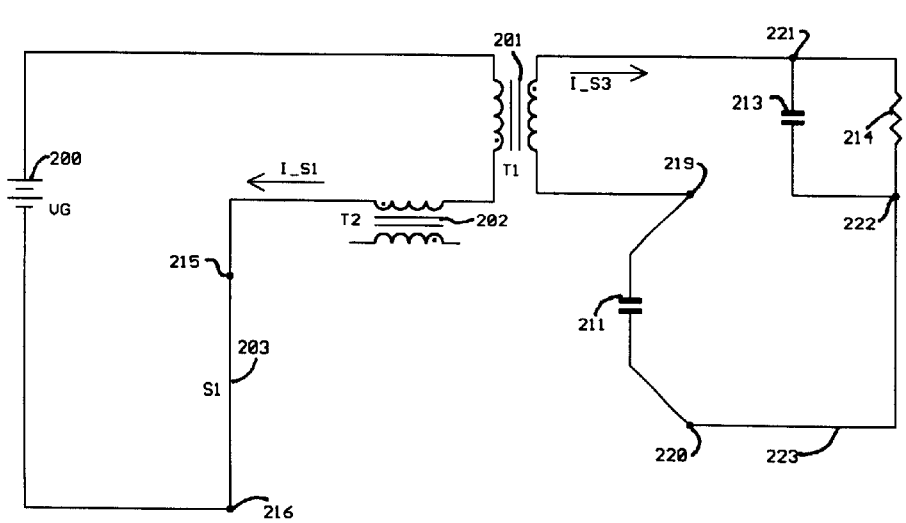
FIG. 33 illustrates a fifth phase of a turn on transition of the FIG. 23 circuit.
Figure 34:
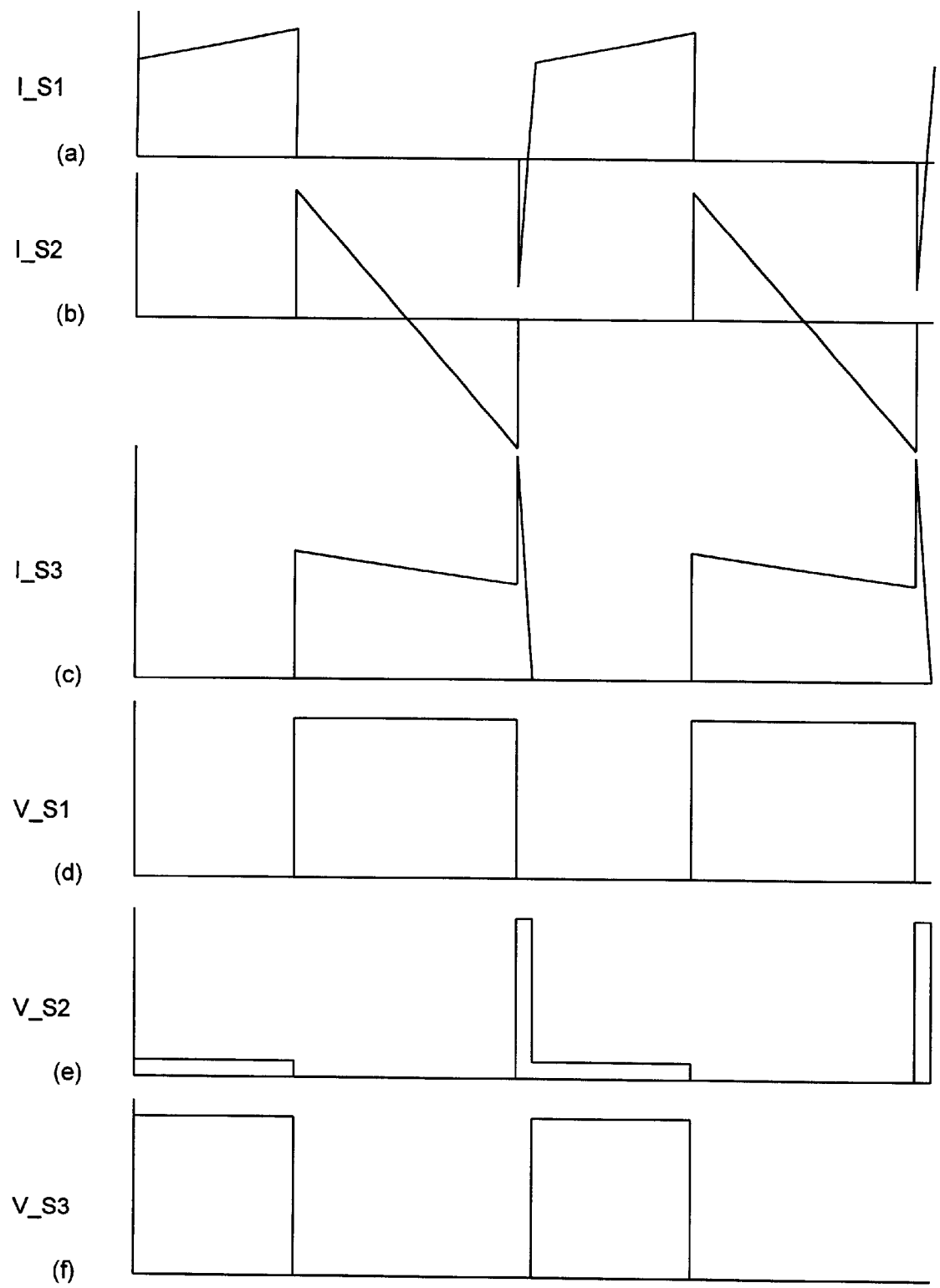
FIG. 34(a) illustrates the switch S1 current wave form of the FIG. 23 circuit.
FIG. 34(b) illustrates the switch S2 current wave form of the FIG. 23 circuit.
FIG. 34(c) illustrates the switch S3 current wave form of the FIG. 23 circuit.
FIG. 34(d) illustrates the switch S1 voltage wave form of the FIG. 23 circuit.
FIG. 34(e) illustrates the switch S2 voltage wave form of the FIG. 23 circuit.
FIG. 34(f) illustrates the switch S3 voltage wave form of the FIG. 23 circuit.

In operation consider an initial condition, which is also the on state of the converter, illustrated in FIG. 24, in which the switch 203 is on (closed), and the other two switches are off (opened). Current flows from the source 200 through the primary windings of the inductors 201 and 202 and through the switch 203. Current also flows to the load 214 from the output capacitor 213. During the on state, the current in the switch 203 is increasing, as illustrated in FIG. 34(a), and the currents in both primary windings are increasing. At a time determined by the control circuit, the switch 203 is turned off. The current flowing in the switch 203 is now diverted into the capacitors 209 and 210, as illustrated in FIG. 25. At the time that the switch 203 is turned off, the voltage at the node 215 begins to rise and the capacitor 209 begins to charge, as the capacitors 210 and 211 begin to discharge, and as the voltages at nodes 217 and 219 fall. The voltages at the nodes 217 and 219 continue to fall until the diodes 207 and 208 become forward biased, as illustrated in FIG. 26. Soon after diodes 207 and 208 become forward biased, the switches 204 and 205 are turned on, as illustrated in FIG. 27. FIG. 27 represents the off state of the converter. During the off state, the current in the secondary winding of the inductor 202 ramps down to zero then ramps up, in the opposite direction, to the same magnitude that it had at the beginning of the off state, as illustrated in FIG. 28 and FIG. 34(b). During the off state, all of the energy stored in the inductor 202 is transferred to the capacitor 212 and then the energy is transferred back to the inductor 202, so that the energy stored in the inductor 202 is the same at the end of the off state as it was at the beginning of the off state, but the current in the inductor 202 is reversed. At a time determined by the control circuit, the switches 204 and 223 are turned off. The current in the inductor 202 is channeled into capacitors 209 and 210, charging capacitor 210 and discharging capacitor 209, as illustrated in FIG. 29. During this time the current in the switch 205 is diverted into the diode 208, as illustrated in figure 29. When the voltage at node 215 falls to the level of the second terminal of source 200, the diode 206 begins to conduct, as illustrated in FIG. 30. Soon after diode 206 begins to conduct, switch 203 is turned on at zero voltage, as illustrated in FIG. 31. At this point there is a large voltage applied across inductor 202, so that the current in the inductor 202 is changing rapidly, as indicated in FIG. 34(a). The current in the inductor 202 will change sign, as illustrated in FIG. 32, and ramp up to the level of the magnetizing current in inductor 201. During this time interval the current in diode 208 is ramping down towards zero, as illustrated in FIG. 34(c). When the current in the diode 208 reaches zero, the voltage at the node 219 begins to rise, as the voltage at the dotted terminal of the primary winding of inductor 201 begins to drop, as the capacitor 211 begins to charge, as illustrated in FIG. 33. When the voltage at the dotted terminal of the primary winding of inductor 201 reaches a level near the second terminal of the source 200, the charging of capacitor 208 is complete and the circuit enters a first on state, which is the initial condition, as illustrated in FIG. 24. During the full cycle of operation each of the three switches were turned on and off at zero voltage.

Related Embodiments

Figure 35:
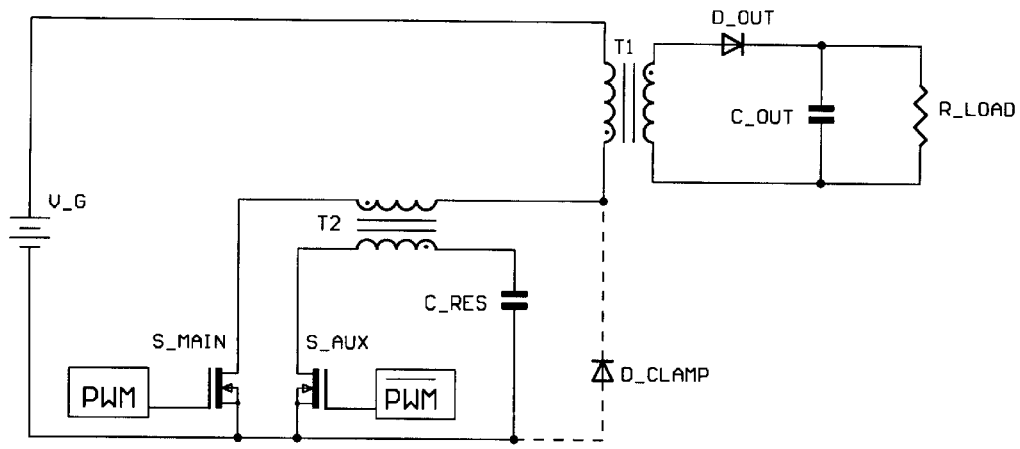
FIG. 35 illustrates the zero voltage switching cell with the reset switch S2 source connected to the main switch S1 source in an isolated flyback converter.

FIG. 35 illustrates an embodiment of the FIG. 23 circuit in which the output switch is implemented with a rectifier diode and the other two switches are implemented with power mosfets. The two mosfets are connected at their source terminals. A PWM controller IC ideally suited for driving the two mosfets with no additional drive circuitry is the UCC3580 made by TI/Unitrode. No high side drive mechanism is required.

Figure 36:
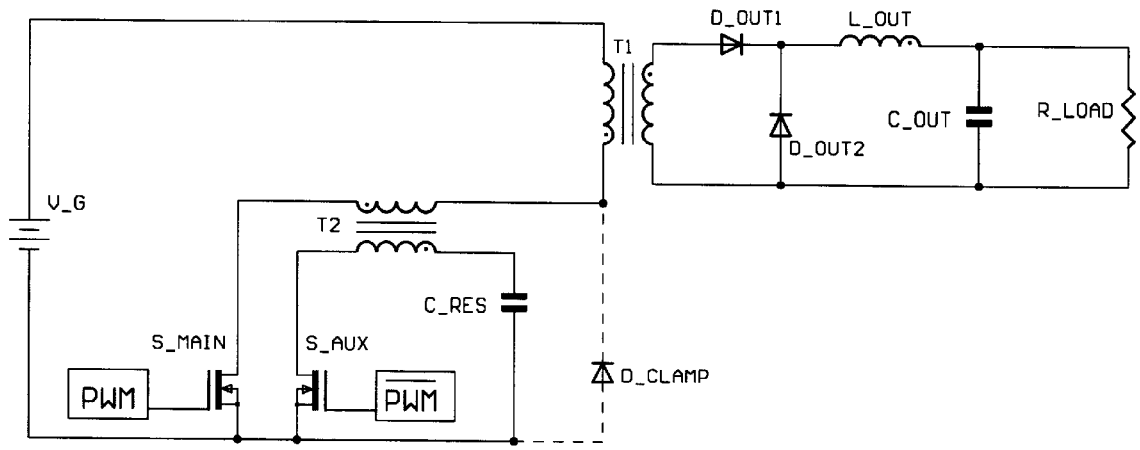
FIG. 36 illustrates the zero voltage switching cell with the reset switch S2 source connected to the main switch S1 source in a forward converter.

FIG. 36 illustrates a single ended forward converter implementation of the subject invention that achieves zero voltage switching and requires no high side drive mechanism.

Figure 37:
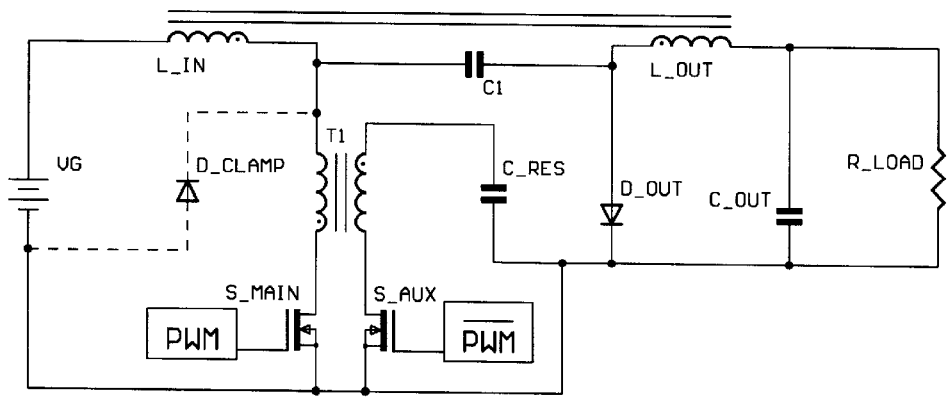
FIG. 37 illustrates the zero voltage switching cell with the reset switch S2 source connected to the main switch S1 source in a Cuk converter.

FIG. 37 illustrates the subject invention applied to a Cuk converter. The circuit achieves zero voltage switching with no high side drive requirement.

Additional Embodiments

Additional embodiments are realized by applying the zero voltage switching cells to other converter topologies. The buck, flyback, forward, and Cuk converters are shown here as examples, but it is clear to one skilled in the art of power conversion that by extending the techniques illustrated and demonstrated here to other hard switching topologies that these other hard switching topologies can be converted from hard switching converters to soft switching converters with the elimination of first order switching losses and with either integral input filtering with no parts penalty or easy implementation without the requirement of a high side drive mechanism.

Conclusion, Ramifications, and Scope of Invention

Thus the reader will see that the zero voltage switching cells of the invention provide a mechanism which significantly reduces switching losses, has low component parts counts, and either provides input filtering or a simplified drive scheme without the requirement of a high side drive mechanism, relying on the energy stored in a small magnetic circuit element.

While my above description contains many specificities, these should not be construed as limitations on the scope of the invention, but rather as exemplifications of preferred embodiments thereof. Many other variations are possible. For example, interleaved, parallel power converters with two or more parallel converter sections; power converters arranged in a bridged configuration for amplifier and inverter applications; power converters similar to those shown in the drawings but which integrate individual magnetic circuit elements onto a single magnetic core; power converters similar to those shown but which have instead high AC ripple voltages on input filter capacitors; power converters, similar to those shown in the drawings, but where the DC input source is instead a varying rectified AC signal. Accordingly, the scope of the invention should be determined not by the embodiments illustrated, but by the appended claims and their legal equivalents.

I claim:

1. A universally applicable zero voltage transition switching cell having a first terminal and a second terminal comprising first switch means having a first terminal and a second terminal with said first terminal of said first switch means connected to said first terminal of said switching cell, an inductor having a first terminal and a second terminal with said first terminal of said inductor connected to said second terminal of said first switch means and with said second terminal of said inductor connected to said second terminal of said switching cell, a switch capacitor series network having a first terminal and a second terminal with said first terminal of said switch capacitor series network connected to said first terminal of said inductor and with said second terminal of said switch capacitor series network connected to said first terminal of said first switch means comprising, a capacitor, second switch means placed in series with said capacitor operable substantially in anti-synchronization to said first switch means, whereby said inductor provides energy to drive a zero voltage turn on transition for said first switch means when placed in a pulse width modulated power converter in which said switching cell is employed in place of the main switch of said pulse width modulated power converter and both the current through said switching cell and the source current of said pulse width modulated power converter are continuous.

2. The switching cell of claim 1 further comprising
a rectifier diode connected to said first terminal and to said second terminal of said switching cell in a parallel connection,
whereby said rectifier diode clamps ringing associated with said inductor and the parasitic capacitance(s) associated with said switch means and other circuit elements external to said switching cell.

3. Any new zero voltage switching power conversion circuit that can be formed by substituting the switching cell of claim 1 for a switch in a known hard switching power conversion circuit.

4. A universally applicable zero voltage transition switching cell having a first terminal, a second terminal, and a third terminal comprising
first switch means having a first terminal and a second terminal with said first terminal of said first switch means connected to said first terminal of said switching cell,
an inductor having a first terminal and a second terminal with said first terminal of said inductor connected to said second terminal of said first switch means and with said second terminal of said inductor connected to said second terminal of said switching cell,
a switch capacitor series network having a first terminal and a second terminal with said first terminal of said switch capacitor series network connected to said first terminal of said inductor and with said second terminal of said switch capacitor series network connected to said third terminal of said switching cell comprising,
a capacitor,
second switch means placed in series with said capacitor operable substantially in anti-synchronization to said first switch means,
whereby said inductor provides energy to drive a zero voltage turn on transition for said first switch means when placed in a pulse width modulated power converter in which said switching cell is employed in place of a main switch of said pulse width modulated power converter connecting said first and second terminals of said switching cell to connections points of said main switch and said third terminal of said switching cell is connected to a point in said pulse width modulated power converter at which the source current of said pulse width modulated power converter can be made to be continuous.

5. The switching cell of claim 4 further comprising
a rectifier diode coupled to said first terminal and to said second terminal of said switching cell in a parallel connection,
whereby said rectifier diode clamps ringing associated with said inductor and the parasitic capacitance(s) associated with said switch means and other circuit elements external to said switching cell.

6. Any new zero voltage switching power conversion circuit that can be formed by substituting the switching cell of claim 4 for a switch in a known hard switching power conversion circuit.

7. A universally applicable zero voltage transition switching cell having a first terminal and a second terminal;
first switch means having a first terminal and a second terminal with said first terminal of said first switch means connected to said first terminal of said switching cell,
a coupled inductor having a primary winding with a first terminal and a second terminal and a secondary winding with a first terminal and a second terminal with said first terminal of said primary winding of said coupled inductor connected to said second terminal of said first switch means and with said second terminal of said primary winding of said coupled inductor connected to said second terminal of said switching cell,
a switch capacitor winding series loop network comprising,
a capacitor having first and second terminals,
second switch means having first and second terminals with said first terminal of said second switch means connected to said first terminal of said capacitor operable substantially in anti-synchronization to said first switch means,
said secondary winding of said coupled inductor with said first terminal of said secondary winding of said coupled inductor connected to said second terminal of said capacitor and with said second terminal of said secondary winding of said coupled inductor connected to said second terminal of said second switch means,
whereby said coupled inductor provides energy to drive a zero voltage turn on transition for said first switch means when placed in a pulse width modulated power converter in which said switching cell is employed in place of a main switch of said pulse width modulated power converter.

8. The switching cell of claim 7 further comprising
a rectifier diode coupled to said first terminal and to said second terminal of said switching cell in a parallel connection,
whereby said rectifier diode clamps ringing associated with said inductor and the parasitic capacitance(s) associated with said switch means and said windings and other circuit elements external to said switching cell.

9. Any new zero voltage switching power conversion circuit that can be formed by substituting the switching cell of claim 7 for a switch in a known hard switching power conversion circuit.

* * * * *